(12) United States Patent  
Yang et al.

(10) Patent No.: US 11,082,045 B2
(45) Date of Patent: Aug. 3, 2021

(54) BIAS CIRCUITRY AND BIASING METHOD

(71) Applicant: Realtek Semiconductor Corporation, Hsinchu (TW)

(72) Inventors: Jun Yang, Jiangsu Province (CN); Jian Liu, Jiangsu Province (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/908,873

(22) Filed: Jun. 23, 2020

(65) Prior Publication Data

US 2021/0006249 A1 Jan. 7, 2021

(30) Foreign Application Priority Data

Jul. 3, 2019 (CN) .......................... 201910594175.2

(51) Int. Cl.
*H03K 19/0175* (2006.01)
*H03K 17/56* (2006.01)

(52) U.S. Cl.
CPC ..... *H03K 19/017509* (2013.01); *H03K 17/56* (2013.01)

(58) Field of Classification Search
CPC ........................ H03K 19/017509; H03K 17/56
USPC ............................................................ 327/333
See application file for complete search history.

(56) References Cited

U.S. PATENT DOCUMENTS

2016/0268971 A1* 9/2016 Seesink .................. H03B 5/364

FOREIGN PATENT DOCUMENTS

CN 101904100 A 12/2010

* cited by examiner

*Primary Examiner* — Tomi Skibinski
(74) *Attorney, Agent, or Firm* — Locke Lord LLP; Tim Tingkang Xia, Esq.

(57) ABSTRACT

A bias circuitry includes a simulation circuit and a level shifter circuit. The simulation circuit is configured to simulate circuit architecture of a processing circuitry, in which the processing circuitry is biased by a bias signal, in order to generate output signals according to input signals. The level shifter circuit is configured to increase a voltage difference between a first node and a second node of the simulation circuit, in which the first node is for tracking an output common mode voltage of the output signals, and the second node is for outputting the bias signal.

20 Claims, 4 Drawing Sheets

400

| simulating the circuit architecture of the processing circuitry 120 by the simulation circuit 142 to generate a bias signal VBN, in which the processing circuitry 120 is biased by the bias signal VBN, in order to generate the output signal VOP and the output signal VON according to the input signal VIP and the input signal VIN | ∽S410 |

| increasing the voltage difference between the node N1 and the node N2 of the simulation circuit 142 by the level shifter circuit 144, in which the node N1 tracks the output common mode voltage VCM_OUT of the output signal VON and the output signal VOP, and the node N2 is configured to output the bias signal VBN | ∽S420 |

Fig. 4

BIAS CIRCUITRY AND BIASING METHOD

RELATED APPLICATION

This application claims priority to China Application Serial Number 201910594175.2, filed Jul. 3, 2019, which is herein incorporated by reference in its entirety.

BACKGROUND

Technical Field

The present disclosure relates to a bias circuitry, and more particularly, to a bias circuitry and a biasing method for biasing a differential input pair circuit.

Description of Related Art

A bias circuit is an important component for operating an analog circuit. By the bias voltage provided from the bias circuit, the analog circuit can be set in the correct operating region (e.g., the saturation region of a transistor) to perform the predetermined operations related thereto (e.g., amplifying a signal, voltage-to-current conversion, etc.). The existing bias circuits are mostly implemented by current mirror circuits. However, in a state in which the bias voltage required by the analog circuit is too low or the input common mode voltage is too high, the setting of the existing bias circuit itself may be faulty to thereby provide an incorrect bias voltage. This results in faulty operation of the analog circuit.

SUMMARY

In order to solve the above problems, one aspect of the present disclosure is to provide a bias circuitry, which includes a simulation circuit and a level shifter circuit. The simulation circuit is configured to simulate a circuit architecture of a processing circuitry, in which the processing circuitry is biased by a bias signal, in order to generate a plurality of output signals according to a plurality of input signals. The level shifter circuit is configured to increase a voltage difference between a first node and a second node of the simulation circuit, in which the first node is configured to track an output common mode voltage of the output signals, and the second node is configured to output the bias signal.

One aspect of the present disclosure is to provide a biasing method, which includes the following operations: simulating a circuit architecture of a processing circuitry by a simulation circuit, in which the processing circuitry is biased by a bias signal, in order to generate a plurality of output signals according to a plurality of input signals; and increasing a voltage difference between a first node and a second node of the simulation circuit, in which the first node is configured to track an output common mode voltage of the output signals, and the second node is configured to output the bias signal.

As described above, the signal processing device, the bias circuitry and the biasing method provided by some embodiments of the present disclosure can improve the operation stability of transistors in the bias circuitry by increasing the voltage difference, and can improve the accuracy of the bias signal by simulating the circuit architecture of the to-be-biased circuitry to detect the dynamic variation of a node voltage.

BRIEF DESCRIPTION OF THE DRAWINGS

FIG. 4 illustrates a flow chart of a biasing method according to some embodiments of the present disclosure.

DETAILED DESCRIPTION

Figure 1:
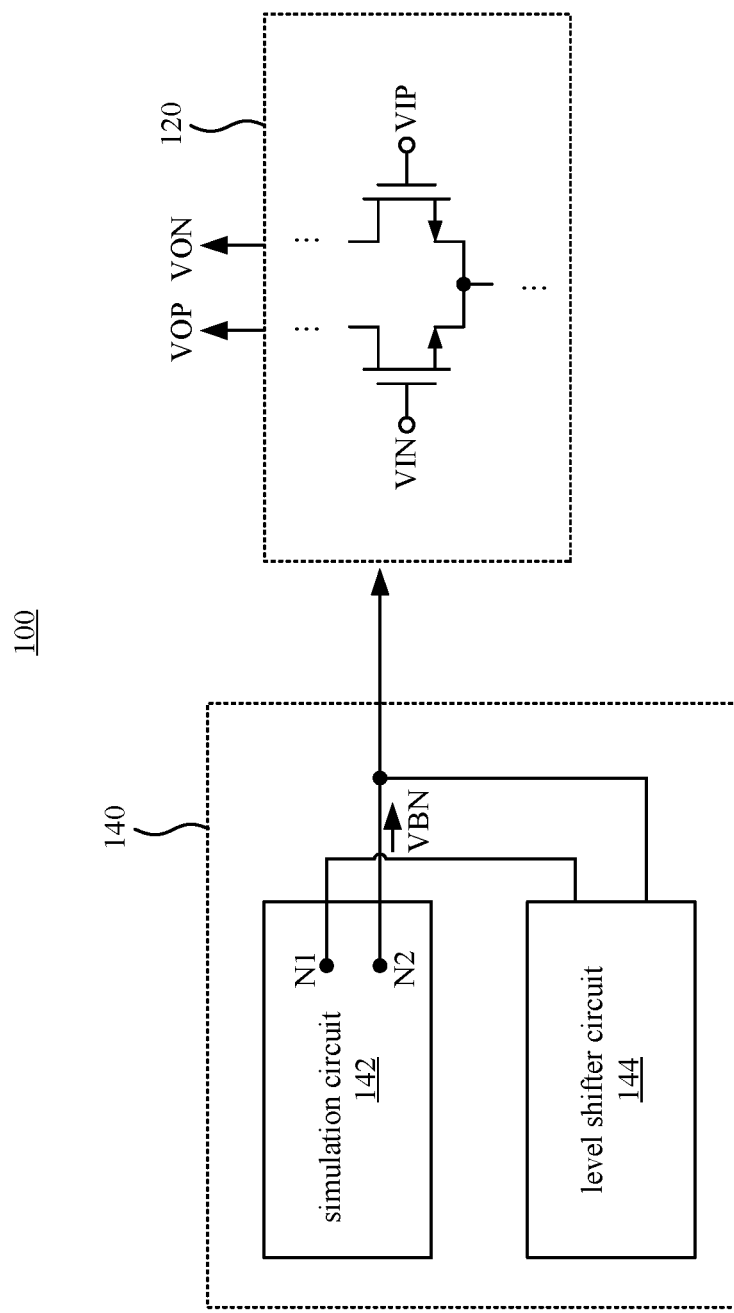
FIG. 1 illustrates a schematic diagram of a signal processing device according to some embodiments of the present disclosure.

The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure. Moreover, the drawings are for the purpose of illustration only, and do not reflect actual sizes. In the description to follow, like reference numerals are used for the same or similar elements.

In addition, in the present disclosure, the term "coupled" may also be termed as "electrically coupled," and the term "connected" may be termed as "electrically connected." "Coupled" and "connected" may also be used to indicate that two or more elements cooperate or interact with each other.

In the present disclosure, the term "circuitry" can generally refer to a single system that includes one or more circuits. The term "circuitry" can generally refer to an object that is connected in a manner by one or more transistors and/or one or more active and passive components for processing signals.

FIG. 1 illustrates a schematic diagram of a signal processing device 100 according to some embodiments of the present disclosure. In various embodiments, the signal processing device 100 may be applied to various types of signal processing circuits, such as a current mode logic (CML) circuit, a linear equalizer, an LC resonant circuit, a differential amplifier, and so on.

The signal processing device 100 includes a processing circuitry 120 and a bias circuitry 140. The processing circuitry 120 is biased by a bias signal VBN, and is configured to generate an output signal VOP and an output signal VON according to an input signal VIN and an input signal VIP. In various applications, the processing circuitry 120 may be part of a CML circuit, an amplifier circuit, an equalizer circuit, an LC resonant circuit, or the like, but the present disclosure is not limited thereto. In some embodiments, the processing circuitry 120 may be any circuit that uses a differential input pair circuit.

The bias circuitry 140 is configured to generate the bias signal VBN according to the input signal VIN and the input signal VIP. The bias circuitry 140 includes a simulation circuit 142 and a level shifter circuit 144. The simulation circuit 142 is configured to simulate the circuit architecture of the processing circuitry 120, in order to track the related variations of the processing circuitry 120 to generate the bias signal VBN. The level shifter circuit 144 is configured to increase the voltage difference between a node N1 and a node N2 of the simulation circuit 142, in which the node N1 is configured to track the output terminal of the processing circuitry 120, and the node N2 is configured to output the bias signal VBN. By the level shifter circuit 144, the voltage level of the node N1 and the voltage level of the node N2 can be more precise, so as to provide a more accurate bias signal VBN. Reference may be made to the description in the following paragraphs for more details of related operations.

Figure 2:
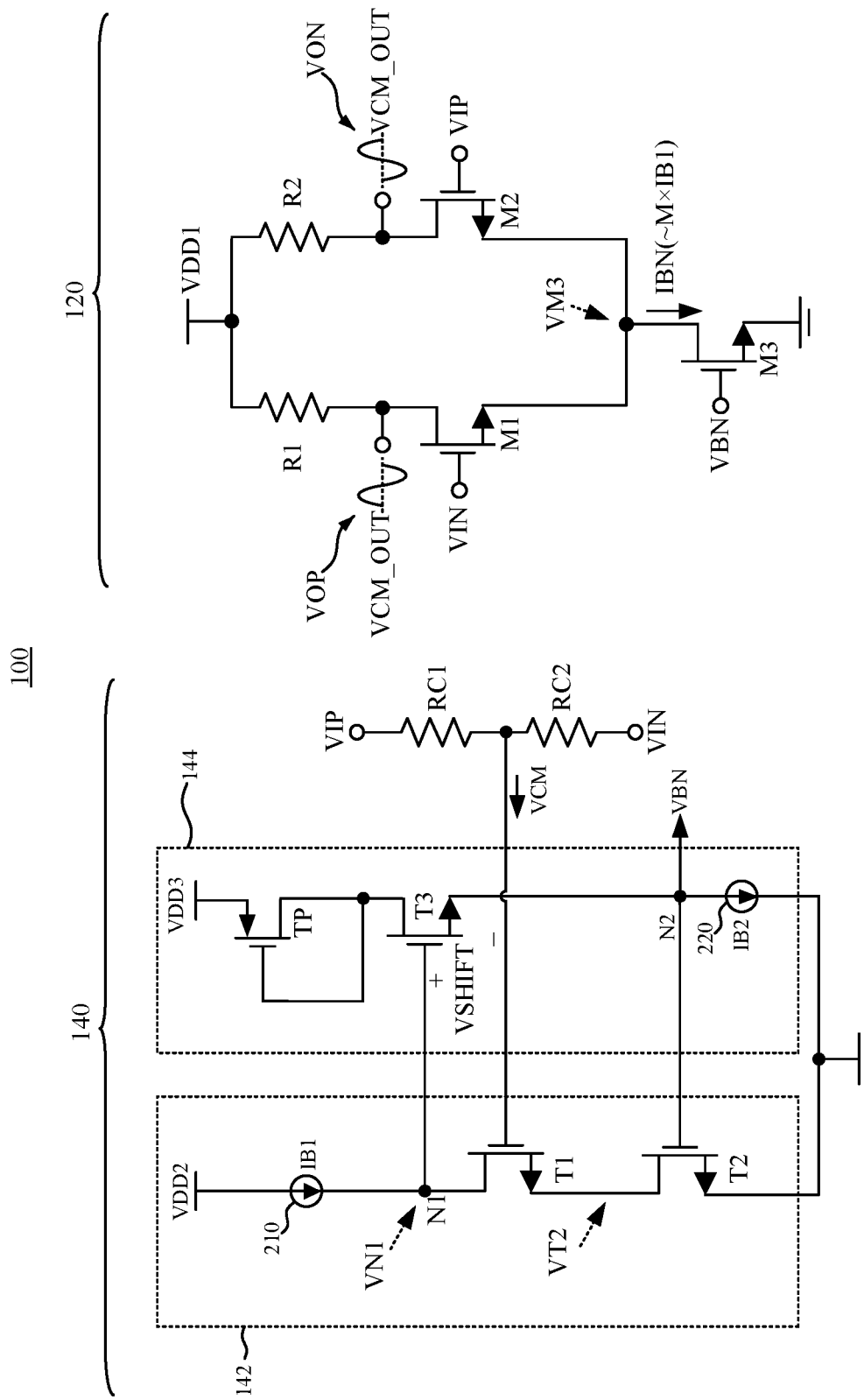
FIG. 2 illustrates a schematic diagram of a signal processing device according to some embodiments of the present disclosure.

Reference is made to FIG. 2. FIG. 2 is a schematic circuit diagram of the signal processing device 100 according to some embodiments of the present disclosure. For easy understanding, similar elements in FIG. 1 and FIG. 2 are designated by the same reference numerals.

In some embodiments, "circuit setting" or "circuit architecture" mentioned herein may refer to the size setting between the corresponding transistors, the bias setting, and the connection relationship therebetween, but the present disclosure is not limited thereto.

In the present embodiment, the processing circuitry 120 includes a plurality of resistors R1-R2, a transistor M1, a transistor M2, and a transistor M3. The first terminal of the resistor R1 is configured to receive a supply voltage VDD1, and the second terminal of the resistor R1 (i.e., an output terminal of the processing circuitry 120) is coupled to the first terminal of the transistor M1 (e.g., the drain), and is configured to generate the output signal VOP. The second terminal of the transistor M1 (e.g., the source) is coupled to the first terminal of the transistor M3. The control terminal of the transistor M1 (e.g., the gate) receives the input signal VIN.

The first terminal of the resistor R2 is configured to receive the supply voltage VDD1, and the second terminal of the resistor R2 (i.e., the other output terminal of the processing circuitry 120) is coupled to the first terminal of the transistor M2, and is configured to generate the output signal VON. The second terminal of the transistor M2 is coupled to the first terminal of the transistor M3. The control terminal of the transistor M2 (e.g., the gate) receives the input signal VIP. In some embodiments, the transistors M1-M2 are configured as a differential input pair circuit.

The second terminal of the transistor M3 is coupled to the ground, and the control terminal of the transistor M3 is configured to receive the bias signal VBN, in order to generate a corresponding current INB to bias the transistors M1-M2.

In the present embodiment, the simulation circuit 142 includes transistors T1-T2 and a current source circuit 210. The transistors T1-T2 and the current source circuit 210 are configured to simulate the circuit architecture of the transistor M1 (and/or the transistor M2) and the transistor M3, in order to track the variations of the transistor M1 (and/or the transistor M2) and the transistor M3.

In greater detail, the first terminal of the current source circuit 210 receives a supply voltage VDD2, and the second terminal of the current source circuit 210 is coupled to the first terminal of the transistor T1 (i.e., the node N1). The current source circuit 210 is configured to provide a current IB1 to the transistor T1. The first terminal of the transistor T1 is further coupled to the level shifter circuit 144. The control terminal of the transistor T1 is configured to receive a common mode voltage VCM related to the input signal VIP and the input signal VIN. The second terminal of the transistor T1 is coupled to the first terminal of the transistor T2. The second terminal of the transistor T2 is coupled to the ground. The control terminal of the transistor T2 is coupled to the node N2, and is configured to output the bias signal VBN.

By this configuration, the voltage VN1 at the node N1 can be configured to track an output common mode voltage VCM_OUT of the first terminals of the transistor M1 and the transistor M2 (i.e., the output terminals of the processing circuitry 120), and the voltage VT2 of the first terminal of the transistor T2 is configured to track the voltage VM3 of the first terminal of the transistor M3. In some embodiments, the aforementioned output common mode voltage VCM_OUT may be half of the sum of the output signal VOP and the output signal VON, i.e., VCM_OUT=0.5×(VOP+VON).

In some embodiments, the bias circuitry 140 further includes resistors RC1 and RC2. The first terminal of the resistor RC1 receives the input signal VIP, and the first terminal of the resistor RC2 receives the input signal VIN. The second terminals of the resistors RC1 and RC2 are coupled together to generate the common mode voltage VCM related to the input signal VIP and the input signal VIN. The aforementioned embodiment of generating the common mode voltage VCM is merely an example, and the present disclosure is not limited thereto.

In some embodiments, the circuit setting of the simulation circuit 142 is related to the circuit setting of the processing circuitry 120. For example, the transistor M3 is set to generate M times the current IB1 (i.e., the current IBN). Under this condition, the size (e.g., the ratio of width to length (W/L)) of the transistor M3 is M times the size of the transistor T2, and the sum of the size of the transistor M1 and the size of the transistor M2 is M times the size of the transistor T1. In some embodiments, M may be a non-zero positive number.

The level shifter circuit 144 includes a transistor T3 and a current source circuit 220. In the present embodiment, the transistor T3 operates as a source follower. The first terminal of the transistor T3 receives a supply voltage VDD3, the second terminal of the transistor T3 and the current source circuit 220 are coupled to the node N2, and the control terminal of the transistor T3 is coupled to the node N1. The current source circuit 220 is coupled between the node N2 and the ground, and is configured to provide a current IB2 to bias the transistor T3.

In the present embodiment, the transistor T3 can provide a voltage difference VSHIFT between the node N1 and the node N2. Thus, the voltage VN1 at the node N1 can be stably higher than the bias signal VBN at the node N2 by a stable voltage difference. The voltage VN1 can be expressed as VN1=VBN+VSHIFT. The voltage difference VSHIFT is the voltage difference between the gate and the source of the transistor T3. In some embodiments, the value of the voltage difference can be adjusted by adjusting the size of the transistor T3 and/or the current IB2.

The aforementioned description is exemplified by the implementation of the source follower, but the present disclosure is not limited thereto. In various embodiments, the level shifter circuit 144 may also be implemented by other circuits that generate a voltage drop, such as a diode circuit, a resistor circuit, and the like.

Ideally, the aforementioned transistors T1-T3 and the transistors M1-M3 are all operated in the saturation region, in order to correctly perform the predetermined operations related thereto. When the transistors T1-T3 and the transistors M1-M3 are all operated in the saturation region, the voltage VN1 at the node N1 can track the output common mode voltage VCM_OUT of the output signal VOP and the output signal VON. However, in some related art, when the bias circuitry operates without the level shifter circuit 144, a node of a transistor (e.g., the node N1) inside the bias circuitry is directly connected to a node of another transistor (e.g., the node N2) to generate the desired bias voltage. In such related art, the operating region of the transistor (e.g., the transistor T1) may become the linear region by error, so that the operating conditions of other transistors have errors. For example, in some special cases (e.g., an operation condition in which the common mode voltage VCM is higher and the bias signal VBN is lower), if the level shifter circuit 144 is not provided, the voltage VN1 is close to the voltage VT2, so that the cross-voltage of two terminals of the transistor T1 becomes lower and thus the transistor T1 wrongly operates in the linear region (also referred to as the triode region). In this state, the bias signal VBN is inaccurate so that the transistor M3 fails to generate the correct current.

In contrast to the above related art, in the embodiment of the present disclosure, the level shifter circuit 144 can increase the voltage level of the voltage VN1 to ensure that the transistor T1 can operate correctly in the saturation region. As a result, the reliability of the signal processing device 100 and the accuracy of the bias signal VBN can be enhanced.

In some embodiments, the first terminal of the transistor T3 can directly receive the supply voltage VDD3. In some embodiments, the level shifter circuit 144 further includes a transistor TP, which is configured as a diode-connected transistor. The first terminal of the transistor TP receives the supply voltage VDD3, and the second terminal and the control terminal of the transistor TP are coupled to the first terminal of the transistor T3. The transistor TP can be configured to prevent the transistor T3 from directly receiving a high voltage (i.e., the supply voltage VDD3), thereby preventing latch-up of the transistor T3. In some embodiments, the transistor TP may be replaced by other components, such as a resistor, a capacitor, etc., but the present disclosure is not limited thereto.

Figure 3:
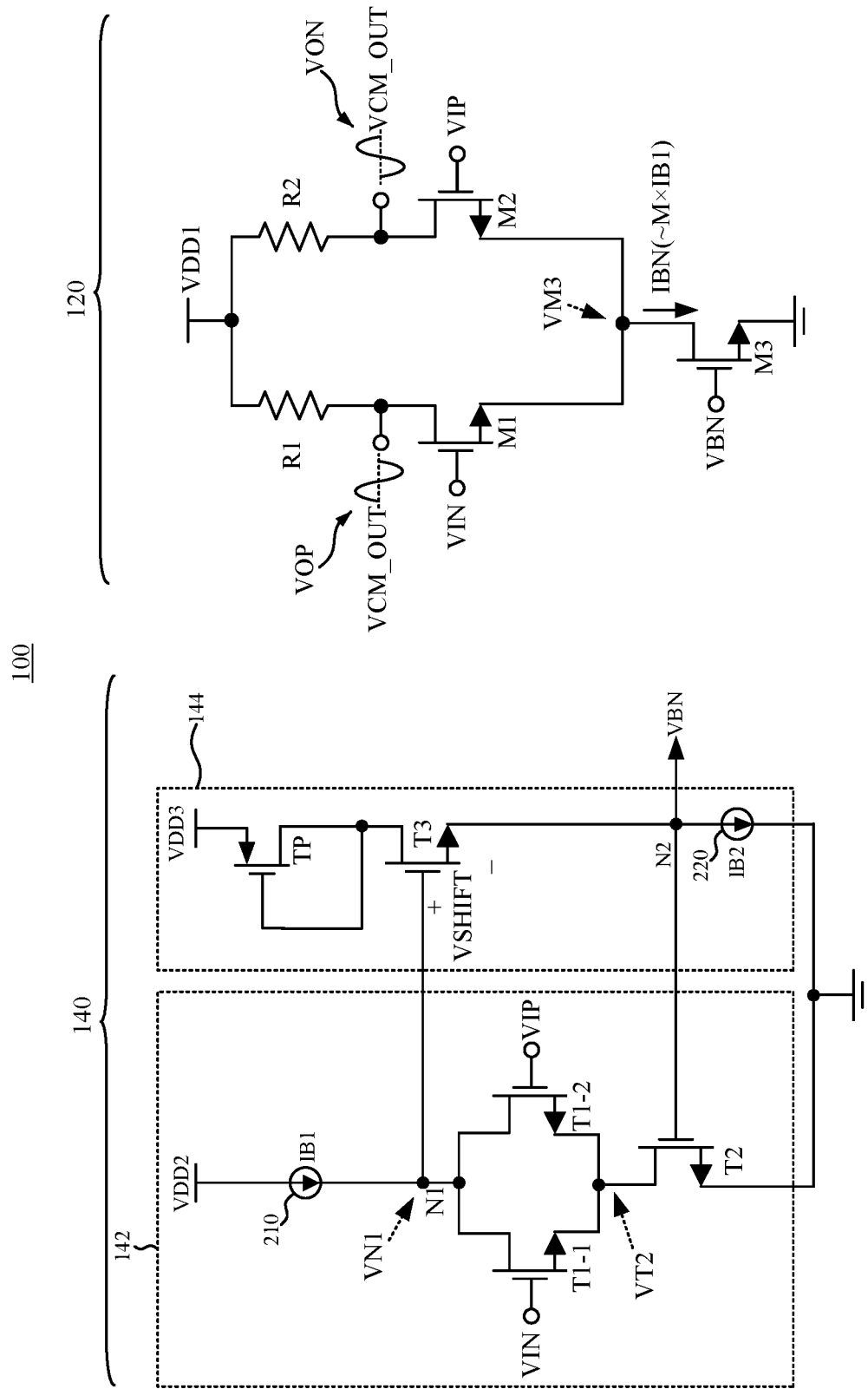
FIG. 3 illustrates a schematic diagram of a signal processing device according to some embodiments of the present disclosure.

Reference is made to FIG. 3. FIG. 3 illustrates a schematic circuit diagram of a signal processing device 100 according to some embodiments of the present disclosure. For easy understanding, similar elements in FIG. 1 to FIG. 3 are designated by the same reference numerals.

Compared to FIG. 2, in the present embodiment, the transistor T1 of the simulation circuit 142 is replaced by a plurality of transistors T1-1 and T1-2. The setting mode of the transistor T1-1 and the transistor T1-2 is configured to simulate the setting mode of the transistor M1 and the transistor M2, in order to detect the dynamic variation of the voltage VM3. In some embodiments, the size of the transistor M1 is M times the size of the transistor T1-1, and the size of the transistor M2 is M times the size of the transistor T1-2.

Specifically, the first terminal of the transistor T1-1 is coupled to the node N1, the second terminal of the transistor T1-1 is coupled to the first terminal of the transistor T2, and the control terminal of the transistor T1-1 receives the input signal VIN. The first terminal of the transistor T1-2 is coupled to the node N1, the second terminal of the transistor T1-2 is coupled to the first terminal of the transistor T2, and the control terminal of the transistor T1-2 receives the input signal VIP. The voltage VN1 at the node N1 can track the output common mode voltage VCM_OUT of the output signal VOP and the output signal VON. Since the input signal VIN and the input signal VIP are alternating current signals, the voltage VM3 varies correspondingly with the transient switching of the input signal VIN and the input signal VIP.

In the present embodiment, by the configuration of the transistor T1-1 and the transistor T1-2, the voltage VT2 can also vary correspondingly with the transient switching of the input signal VIN and the input signal VIP, so as to track the voltage VM3 more precisely. As a result, when the voltage VM3 varies, the voltage VT2 also has the corresponding variation. In response to the variation of the voltage VT2, the bias signal VBN also varies correspondingly to ensure that the current IBN is stabilized.

Each of the aforementioned embodiments is described by taking N-type transistors as an example, but the present disclosure is not limited to the aforementioned embodiments. In accordance with the teachings of the aforementioned embodiments, other embodiments of the present disclosure may also implement the corresponding circuits by P-type transistors. Therefore, embodiments of various types of transistors are within the scope of the present disclosure.

In some embodiments, the aforementioned supply voltages VDD1-VDD3 may be the same voltage. In some embodiments, the aforementioned supply voltages VDD1-VDD3 may be different voltages.

The aforementioned embodiments are described by taking metal oxide semiconductor field effect transistors (MOSFETs) as an example, but the present disclosure is not limited to the aforementioned embodiments. According to the teachings of the aforementioned embodiments, other embodiments of the present disclosure may also implement the corresponding circuits by other types of field effect transistors. Therefore, embodiments of various types of field effect transistors are within the scope of the present disclosure.

Reference is made to FIG. 4. FIG. 4 illustrates a flow chart of a biasing method 400 according to some embodiments of the present disclosure.

In operation S410, the circuit architecture of the processing circuitry 120 is simulated by the simulation circuit 142 to generate a bias signal VBN, in which the processing circuitry 120 is biased by the bias signal VBN, in order to generate the output signal VOP and the output signal VON according to the input signal VIP and the input signal VIN.

In operation S420, the voltage difference between the node N1 and the node N2 of the simulation circuit 142 is increased by the level shifter circuit 144, in which the node N1 tracks the output common mode voltage VCM_OUT of the output signal VON and the output signal VOP, and the node N2 is configured to output the bias signal VBN.

For a description of the above operations S410 and S420, reference may be made to the embodiments in FIG. 1 to FIG. 3, and thus a description in this regard will not be repeated. The above description of the biasing method 400 includes exemplary operations, but the operations thereof are not necessarily performed in the order described. The operations of the biasing method 400 are able to be added, replaced, omitted, or performed in a different order, in accordance with the spirit and scope of various embodiments of the present disclosure.

As described above, the signal processing device, the bias circuitry and the biasing method provided by some embodiments of the present disclosure can improve the operation stability of transistors in the bias circuitry by increasing the voltage difference, and can improve the accuracy of the bias signal by simulating the circuit architecture of the to-be-biased circuitry to detect the dynamic variation of a node voltage.

Although the present disclosure has been described in considerable detail with reference to certain embodiments thereof, other embodiments are possible. It will be apparent to those skilled in the art that various modifications and variations can be made to the structure of the present disclosure without departing from the scope or spirit of the disclosure. Therefore, the spirit and scope of the appended claims should not be limited to the description of the embodiments contained herein.

What is claimed is:

1. A bias circuitry, comprising:
   a simulation circuit configured to simulate a circuit architecture of a processing circuitry, wherein the processing circuitry is biased by a bias signal, in order to generate a plurality of output signals according to a plurality of input signals; and
   a level shifter circuit configured to increase a voltage difference between a first node and a second node of the simulation circuit, wherein the first node is configured to track an output common mode voltage of the output signals, and the second node is configured to output the bias signal.

2. The bias circuitry of claim 1, wherein the processing circuitry comprises an input pair circuit and a first transistor, the input pair circuit receives the input signals and generates the output signals, the first transistor generates a first current according to the bias signal to bias the input pair circuit, and the simulation circuit comprises:
   a second transistor coupled to the first node, and configured to simulate the input pair circuit, wherein a control terminal of the second transistor is configured to receive a common mode voltage related to the input signals; and
   a third transistor coupled between the second transistor and a ground, and configured to simulate the first transistor, wherein a control terminal of the third transistor is coupled to the second node.

3. The bias circuitry of claim 2, wherein the simulation circuit further comprises:
   a first current source circuit configured to provide a second current to bias the second transistor and the third transistor.

4. The bias circuitry of claim 3, wherein the first current is set to be M times the second current, the size of the first transistor is M times the size of the third transistor, the sum of the sizes of a plurality of transistors in the input pair circuit is M times the size of the second transistor, and M is a non-zero positive number.

5. The bias circuitry of claim 2, wherein the bias circuitry further comprises:
   a plurality of resistors coupled in series with each other, and generating the common mode voltage according to the input signals.

6. The bias circuitry of claim 1, wherein the level shifter circuit comprises:
   a first transistor configured to provide the voltage difference, wherein a first terminal of the first transistor is configured to receive a supply voltage, a second terminal of the first transistor is coupled to the second node, and a control terminal of the first transistor is coupled to the first node; and
   a current source circuit coupled between the second node and a ground, and configured to provide a current to the first transistor.

7. The bias circuitry of claim 6, wherein the level shifter circuit further comprises:
   a second transistor, wherein a first terminal of the second transistor receives the supply voltage, and a second terminal and a control terminal of the second transistor are coupled to the first terminal of the first transistor.

8. The bias circuitry of claim 6, wherein the first transistor is configured as a source follower.

9. The bias circuitry of claim 1, wherein the processing circuitry comprises an input pair circuit and a first transistor, the input pair circuit receives the input signals and generates the output signals, the first transistor generates a first current according to the bias signal to bias the input pair circuit, and the simulation circuit comprises:
   a second transistor, wherein a first terminal of the second transistor is coupled to the first node, and a control terminal of the second transistor is configured to receive a first input signal of the input signals;
   a third transistor, wherein a first terminal of the third transistor is coupled to the first node, and a control terminal of the third transistor is configured to receive a second input signal of the input signals, and the second transistor and the third transistor are configured to simulate a plurality of transistors of the input pair circuit; and
   a fourth transistor coupled between second terminal of the second transistor, a second terminal of the third transistor and a ground, and configured to simulate the first transistor, wherein a control terminal of the fourth transistor is coupled to the second node.

10. The bias circuitry of claim 9, wherein the simulation circuit further comprises:
    a current source circuit configured to provide a second current to bias the second transistor, the third transistor and the fourth transistor.

11. The bias circuitry of claim 10, wherein the first current is set to be M times the second current, the size of the first transistor is M times the size of the fourth transistor, the size of each of the plurality of transistors of the input pair circuit is M times the size of the second transistor or the third transistor, and M is a non-zero positive number.

12. A biasing method, comprising:
    simulating a circuit architecture of a processing circuitry by a simulation circuit, wherein the processing circuitry is biased by a bias signal, in order to generate a plurality of output signals according to a plurality of input signals; and
    increasing a voltage difference between a first node and a second node of the simulation circuit, wherein the first node is configured to track an output common mode voltage of the output signals, and the second node is configured to output the bias signal.

13. The biasing method of claim 12, wherein the processing circuitry comprises an input pair circuit and a first transistor, the input pair circuit receives the input signals and generates the output signals, the first transistor generates a first current according to the bias signal to bias the input pair circuit, wherein simulating the circuit architecture of the processing circuitry by the simulation circuit comprises:
    simulating the input pair circuit by a second transistor of the simulation circuit, wherein the second transistor is coupled to the first node and a control terminal of the second transistor is configured to receive a common mode voltage related to the input signals; and
    simulating the first transistor by a third transistor of the simulation circuit, wherein the third transistor is coupled between the second transistor and a ground, and a control terminal of the third transistor is coupled to the second node.

14. The biasing method of claim 13, wherein simulating the circuit architecture of the processing circuitry by the simulation circuit further comprises:
    providing a second current by a first current source circuit of the simulation circuit to bias the second transistor and the third transistor.

15. The biasing method of claim 14, wherein the first current is set to be M times the second current, and the size of the first transistor is M times the size of the third transistor, the sum of the sizes of a plurality of transistors of the input pair circuit is M times the size of the second transistor, and M is a non-zero positive number.

16. The biasing method of claim 12, wherein the processing circuitry comprises an input pair circuit and a first transistor, the input pair circuit receives the input signals and generates the output signals, the first transistor generates a first current according to the bias signal to bias the input pair circuit, wherein simulating the circuit architecture of the processing circuitry by the simulation circuit comprises:

simulating a plurality of transistors of the input pair circuit by a second transistor and a third transistor of the simulation circuit,
wherein a first terminal of the second transistor is coupled to the first node, and a control terminal of the second transistor is configured to receive a first input signal of the input signals, a first terminal of the third transistors is coupled to the first node, and a control terminal of the third transistor is configured to receive a second input signal of the input signals; and
simulating the first transistor by a fourth transistor of the simulation circuit, wherein the fourth transistor is coupled to a second terminal of the second transistor, a second terminal of the third transistor and a ground, and a control terminal of the fourth transistor is coupled to the second node.

17. The biasing method of claim 16, wherein simulating the circuit architecture of the processing circuitry by the simulation circuit further comprises:

providing a second current by a current source circuit of the simulation circuit to bias the second transistor and the third transistor.

18. The biasing method of claim 17, wherein the first current is set to be M times the second current, the size of the first transistor is M times the size of the fourth transistor, the size of each of the plurality of transistors of the input pair circuit is M times the size of the second transistor or the third transistor, and M is a non-zero positive number.

19. The biasing method of claim 12, wherein increasing the voltage difference between the first node and the second node of the simulation circuit comprises:

providing the voltage difference by a first transistor, wherein a first terminal of the first transistor is configured to receive a supply voltage, a second terminal of the first transistor is coupled to the second node, and a control terminal of the first transistor is coupled to the first node; and
providing a current to the first transistor by a current source circuit.

20. The biasing method of claim 19, wherein increasing the voltage difference between the first node and the second node of the simulation circuit further comprises:

transmitting the supply voltage to the first transistor through a second transistor, wherein a first terminal of the second transistor receives the supply voltage, and a second terminal and a control terminal of the second transistor are coupled to the first terminal of the first transistor.

* * * * *